(12) United States Patent
Sewell et al.

(10) Patent No.: US 7,561,252 B2
(45) Date of Patent: Jul. 14, 2009

(54) INTERFEROMETRIC LITHOGRAPHY SYSTEM AND METHOD USED TO GENERATE EQUAL PATH LENGTHS OF INTERFERING BEAMS

(75) Inventors: Harry Sewell, Ridgefield, CT (US); Johannes Jacobus Matheus Baselmans, Oirschot (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 503 days.

(21) Appl. No.: 11/320,473

(22) Filed: Dec. 29, 2005

(65) Prior Publication Data

US 2007/0153250 A1 Jul. 5, 2007

(51) Int. Cl.
*G03B 27/54* (2006.01)
*G03B 27/72* (2006.01)

(52) U.S. Cl. .......................................... 355/67; 355/69
(58) Field of Classification Search ................ 355/69, 355/67, 53, 71, 55; 430/312, 316, 311; 353/122; 250/548
See application file for complete search history.

(56) References Cited

U.S. PATENT DOCUMENTS

| | | |
|---|---|---|
| 4,560,249 A | 12/1985 | Nishiwaki et al. |
| 4,596,467 A | 6/1986 | Bartelt |
| 4,792,197 A | 12/1988 | Inoue et al. |
| 4,806,454 A | 2/1989 | Yoshida et al. |
| 5,142,385 A | 8/1992 | Anderson et al. |
| 5,414,835 A | 5/1995 | Iijima |
| 5,640,239 A | 6/1997 | Takamiya et al. |
| 5,705,321 A | 1/1998 | Brueck et al. |
| 5,759,744 A | 6/1998 | Brueck et al. |
| 5,771,098 A | 6/1998 | Ghosh et al. |
| RE36,113 E | 2/1999 | Brueck et al. |

(Continued)

FOREIGN PATENT DOCUMENTS

DE 1 094 484 12/1960

(Continued)

OTHER PUBLICATIONS

English translation generated by a machine of foreign patent DE 1,094,484, Leitz et al., filed Dec. 8, 1960, 7 pages.

(Continued)

*Primary Examiner*—Peter B Kim
(74) *Attorney, Agent, or Firm*—Pillsbury Winthrop Shaw Pittman LLP

(57) ABSTRACT

A system and method are provided for writing patterns onto substrates. First and second beams are directed to converge and substantially overlap in a common region on a substrate. This can be done so that the first and second beams are mutually temporally coherent and spatially coherent in the region of overlap to form interference fringes to define a writing image. A beam width of the first and second beams is adjusted. This can be done so that respective path lengths of the beams are matched when they reach the common region to ensure the first and second beams are mutually spatially coherent and temporally coherent across an entire width of the common region. In one example, the substrate is moved with respect to the writing image, while writing patterns onto the substrate. In another example, the substrate remains stationary.

36 Claims, 9 Drawing Sheets

U.S. PATENT DOCUMENTS

| | | |
|---|---|---|
| 6,013,396 A | 1/2000 | Capodieci |
| 6,178,000 B1 | 1/2001 | Hoffnagle |
| 6,185,019 B1 | 2/2001 | Hobbs et al. |
| 6,233,044 B1 | 5/2001 | Brueck et al. |
| 6,304,318 B1 | 10/2001 | Matsumoto |
| 6,556,280 B1 | 4/2003 | Kelsey et al. |
| 6,830,850 B1 | 12/2004 | Krivokapic et al. |
| 6,882,477 B1 | 4/2005 | Schattenburg et al. |
| 2001/0021487 A1 | 9/2001 | Williams et al. |
| 2001/0035991 A1 | 11/2001 | Hobbs et al. |
| 2002/0030802 A1 | 3/2002 | Sugita et al. |
| 2002/0031725 A1 | 3/2002 | Sugita et al. |
| 2002/0134985 A1 | 9/2002 | Chen et al. |
| 2002/0149751 A1 | 10/2002 | Bloomstein et al. |
| 2002/0149757 A1 | 10/2002 | Kelsey et al. |
| 2002/0149849 A1 | 10/2002 | Kelsey et al. |
| 2002/0191288 A1 | 12/2002 | Gruner et al. |
| 2003/0098979 A1 | 5/2003 | Dress et al. |
| 2003/0147082 A1 | 8/2003 | Goldstein |
| 2004/0042724 A1 | 3/2004 | Gombert et al. |
| 2004/0110092 A1 | 6/2004 | Lin |
| 2004/0223385 A1 | 11/2004 | Fleming et al. |
| 2005/0012933 A1 | 1/2005 | Matthews |
| 2005/0057735 A1 | 3/2005 | Smith |
| 2005/0064297 A1 | 3/2005 | Wago |
| 2005/0073671 A1 | 4/2005 | Borodovsky |
| 2005/0074698 A1 | 4/2005 | Borodovsky |
| 2005/0088633 A1 | 4/2005 | Borodovsky |
| 2005/0094152 A1 | 5/2005 | Allen |
| 2005/0105100 A1 | 5/2005 | Swindal |
| 2005/0168717 A1 | 8/2005 | Hinsberg et al. |

FOREIGN PATENT DOCUMENTS

| | | |
|---|---|---|
| EP | 0243520 B1 | 11/1991 |
| JP | 61-190368 A | 8/1986 |
| JP | 3-263313 A | 11/1991 |
| JP | 4-163461 A | 6/1992 |
| JP | 5-072408 A | 3/1993 |
| JP | 5-217856 A | 8/1993 |
| JP | 6-053122 A | 2/1994 |
| JP | 6-053122 U | 7/1994 |
| JP | 10-270330 A | 10/1998 |
| JP | 2000-021716 A | 1/2000 |
| JP | 2000-021720 A | 1/2000 |
| JP | 2000-223400 A | 8/2000 |
| JP | 2001-007020 A | 1/2001 |
| JP | 2001-223149 A | 8/2001 |
| JP | 2002-162750 A | 6/2002 |
| JP | 2004-014866 A | 1/2004 |
| JP | 2004-014867 A | 1/2004 |
| JP | 2004-317922 A | 11/2004 |
| JP | 2005-099537 A | 4/2005 |
| JP | 2005-134873 A | 5/2005 |
| KR | 9401227 B1 | 2/1994 |
| WO | WO 98/18049 A1 | 4/1998 |
| WO | WO 2004/003611 A1 | 1/2004 |
| WO | WO 2004/088363 A1 | 10/2004 |

OTHER PUBLICATIONS

International Search Report and Written Opinion for Application No. PCT/US06/46313, mailed on Oct. 10, 2007, 6 pages.

INTERFEROMETRIC LITHOGRAPHY SYSTEM AND METHOD USED TO GENERATE EQUAL PATH LENGTHS OF INTERFERING BEAMS

BACKGROUND

1. Field of the Invention

The present invention relates to lithographic systems, and more particularly to interferometric lithography.

2. Related Art

A lithographic apparatus is a machine that applies a desired pattern onto a substrate or part of a substrate. A lithographic apparatus can be used, for example, in the manufacture of flat panel displays, integrated circuits (ICs) and other devices involving fine structures. In a conventional apparatus, a patterning device, which is commonly referred to as a mask or a reticle, can be used to generate a circuit pattern corresponding to an individual layer of a flat panel display (or other device). This pattern can be transferred onto all or part of the substrate (e.g., a glass plate), by imaging onto a layer of radiation-sensitive material (e.g., photoresist) provided on the substrate.

Instead of a circuit pattern, the patterning means can be used to generate other patterns, for example a color filter pattern or a matrix of dots. Instead of a mask, the patterning device can comprise a patterning array that comprises an array of individually controllable elements. The pattern can be changed more quickly and for less cost in such a system compared to a mask-based system.

A flat panel display substrate is typically rectangular in shape. Lithographic apparatus designed to expose a substrate of this type can provide an exposure region that covers a full width of the rectangular substrate, or covers a portion of the width (for example half of the width). The substrate can be scanned underneath the exposure region, while the mask or reticle is synchronously scanned through a beam. In this way, the pattern is transferred to the substrate. If the exposure region covers the full width of the substrate then exposure can be completed with a single scan. If the exposure region covers, for example, half of the width of the substrate, then the substrate can be moved transversely after the first scan, and a further scan is typically performed to expose the remainder of the substrate.

Resolution achieved by the overall semiconductor manufacturing process depends not only on the optics involved, but also on the chemical processes employed (e.g., interactions between the photoresist and the etching chemicals, etc.).

When resolutions reach nanometer scale, such as 30-100 nm, it is very difficult to use conventional masks, reticles, and patterning arrays to accomplish this. The current resolution limit of lens-based systems is approximately 45 nm.

Interferometric lithography tools have been proposed, either within an immersion system or by themselves, to form small nanometer scale features. These typically use a Talbot interferometer scheme. In order to achieve higher resolutions, non-symmetrical Talbot interferometer schemes have been suggested. However, it is sometimes very difficult to achieve a desirable fringe contrast across a large image field when using these systems because of path length differences within the interfering beams.

Therefore, what is needed is an interferometric lithography system and method that generates a desired contrast across an entire field at resolution dimensions matching or surpassing current conventional, lens based lithography system capabilities.

SUMMARY

In a first embodiment of the present invention, there is provided a method to write patterns onto a substrate comprising the following steps. Directing first and second beams to converge and substantially overlap in a common region on the substrate, such that the first and second beams are mutually temporally coherent and spatially coherent in the region of overlap to form interference fringes and thereby define a writing image. By adjusting a beam width of the first and second beams, such that respective path lengths of the beams are matched when they reach the common region to ensure the first and second beams are mutually spatially coherent and temporally coherent across a full width of the common region. In alternative examples, the substrate is moved relative to the first and second beams during writing of the image onto the substrate or remains stationary during writing.

Another embodiment of the present invention provides a system for writing a pattern onto a substrate comprising an optical directing device and first and second beam width adjusting systems. The optical directing device directs first and second beams to converge and substantially overlap at a common region on the substrate, the first and second beams being mutually spatially coherent and temporally coherent, such that in the common region of overlap, overlapping beams form interference fringes to define a writing image. The first and second beam width adjusting systems are located in respective beam paths of the first and second light beams, such that respective path lengths of the beams are matched when they reach the common region of overlap to maintain the spatial coherence and temporal coherence of the beams across the common region of overlap. In alternative examples, the substrate is moved relative to the first and second beams during writing of the image onto the substrate or remains stationary during writing.

A further embodiment of the present invention provides a system comprising a beam splitter, first and second beam width adjusting systems, and first and second reflectors. The beam splitter splits a beam of radiation into first and second beams. The first and second beam width adjusting systems receive respective ones of the first and second beams and output respective first and second beam width adjusted beams. The first and second reflectors receive the first and second beam width adjusted beams and direct the first and second beam width adjusted beams to interfere at an image field of a substrate, such that fringes formed by the interference form an image on the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate one or more embodiments of the present invention and, together with the description, further serve to explain the principles of the invention and to enable a person skilled in the pertinent art to make and use the invention.

Figure 1:
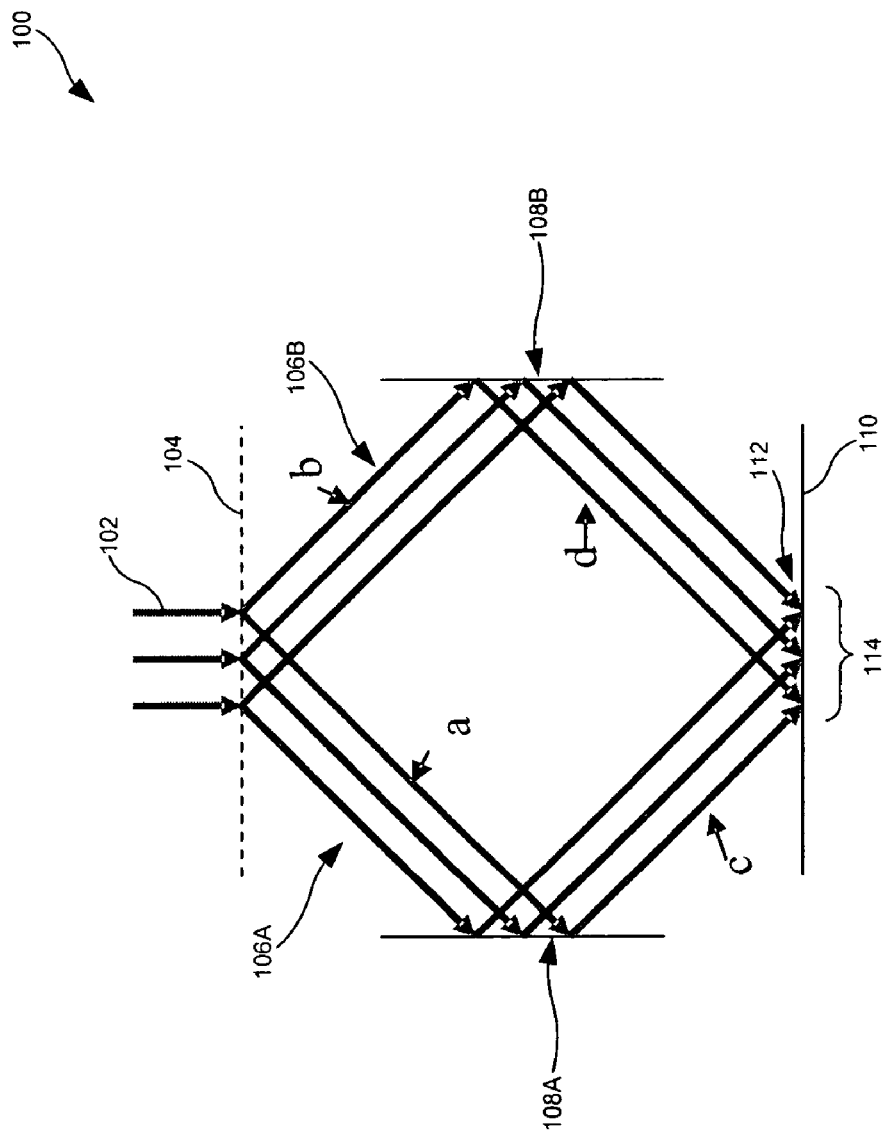
FIGS. 1 and 2 illustrate exemplary Talbot interferometric patterning systems.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the pertinent art that this invention can also be employed in a variety of other applications.

Exemplary Interferometric Lithography Systems

FIG. 1 illustrates an interferometric lithographic system 100, commonly known in the art as a Talbot interferometer. A spatially and temporally coherent light beam 102, normally generated by a laser (not shown), is incident on a beam splitter 104 (e.g., a diffractive device, a diffraction grating, a phase shifting beam splitter, or the like). Beam splitter 104 separates beam 102 into first and second beams 106A and 106B. The two beams 106A and 106B are then redirected by first and second reflecting surfaces 108A and 108B, respectively, towards a substrate 110 (e.g., a workpiece, a display, or the like, hereinafter referred to as a substrate). Each path from beam splitter 104 to substrate 110 is sometimes referred as an "arm" of the interferometer 100. Exemplary conventional Talbot interferometers include U.S. Pat. Nos. 6,882,477 and 4,596,467 and U.S. Published Patent Application Nos. 2004-011092-A1 and 2005-0073671, which are all incorporated by reference herein in their entireties.

An interference pattern 112 is formed at a top surface of substrate 110. Interference pattern 112 exposes a photoresist layer (not labeled in FIG. 1) with a writing image. For example, first and second beams 106A and 106B can be projected onto substrate 110 to interfere to exposure a plurality of lines on substrate 110, corresponding to lines of maxima caused by constructive interference between the beams of radiation, separated by minima caused by destructive interference between the two beams of radiation It is to be appreciated that substrate 110 can be located on a stage or table (not shown) that allows for movement of the substrate 110 with respect to the writing image, e.g., scanning, stepping, or the like, to allow for patterning of an entire surface of the substrate 110. In another example, substrate 110 can be stationary during imaging of the whole substrate 110.

In one example, beam splitter 104 produces only first order beams as beams 106A and 106B. In various examples, beam splitter 104 can be a phase shifting, alternating phase shifting, binary phase shifting, or another type of beam splitter, as would apparent to a skilled artisan upon reading this description.

In one example, beam 106A has a path length a between beam splitter 104 and reflecting surface 108A, while beam 106B has a path length b between beam splitter 104 and reflecting surface 108B. Similarly, beam 106A has a path length c between reflecting surface 108A and substrate 110, while beam 106B has a path length d between reflecting surface 108B and substrate 110. In the example shown, Talbot interferometer 100 is generally referred to as a symmetrical system because a+c=b+d, which produces substantially uniform fringes 112 across an exposure field 114, which is desirable.

In one example, coherent radiation 102 is produced by an illuminator (not shown) that receives a radiation beam from a radiation source (not shown). In one example, the radiation source can provide radiation having a wavelength of at least 5 nm, e.g., at least 10 nm, at least 50 nm, at least 100 nm, at least 150 nm, at least 175 nm, at least 200 nm, at least 250 nm, at least 275 nm, at least 300 nm, at least 325 nm, at least 350 nm, or at least 360 nm. In one example, the radiation provided by radiation source SO has a wavelength of at most 450 nm, e.g., at most 425 nm, at most 375 nm, at most 360 nm, at most 325 nm, at most 275 nm, at most 250 nm, at most 225 nm, at most 200 nm, or at most 175 nm. In one example, the radiation has a wavelength including 436 nm, 405 nm, 365 nm, 355 nm, 248 nm, 193 nm, 157 nm, and/or 126 nm. In one example, the radiation includes a wavelength of around 365 nm or around 355 nm. In one example, the radiation includes a broad band of wavelengths, for example encompassing 365, 405, and 436 nm. A 355 nm laser source could be used.

The source and the lithographic apparatus can be separate units or subsystems, for example when the source is an excimer laser. In such cases, the source is not considered to form part of the lithographic apparatus and the radiation beam is passed from the source to an illuminator with the aid of a beam delivery system comprising, for example, suitable directing mirrors and/or a beam expander.

Figure 2:
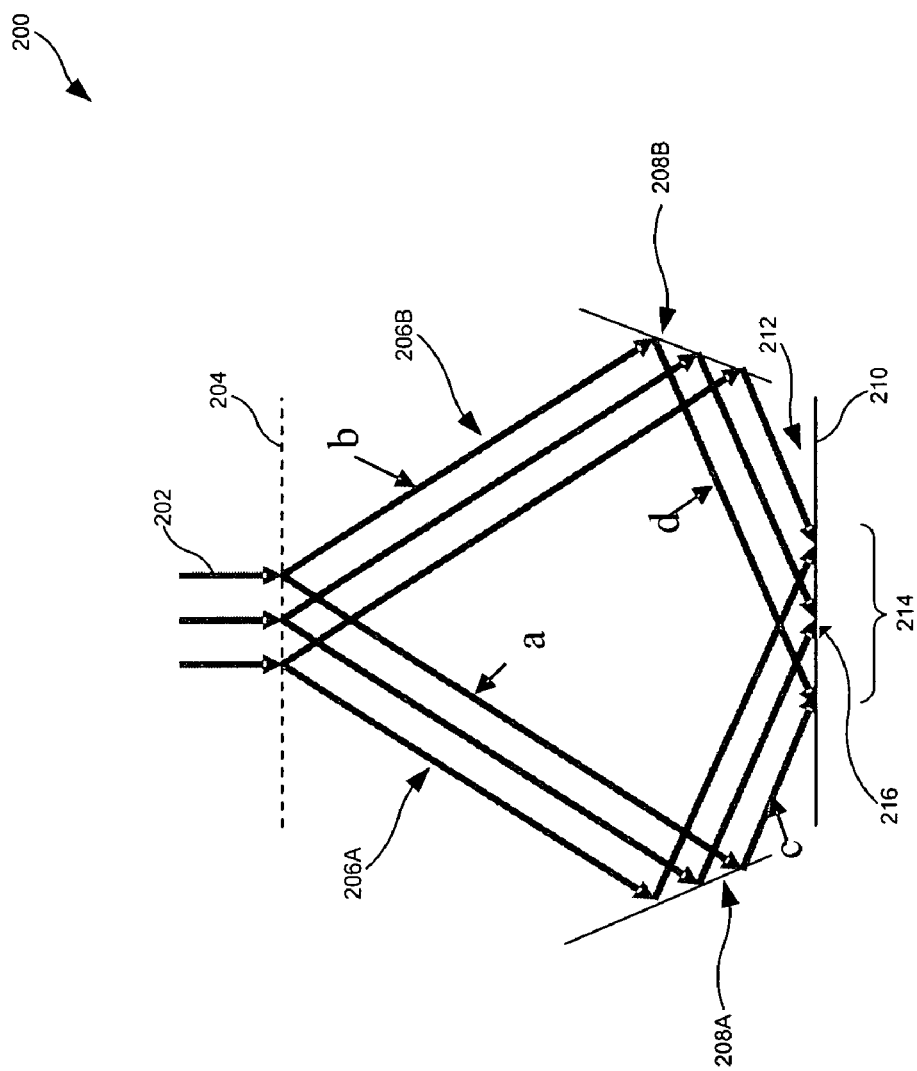

FIG. 2 illustrates another interferometric lithographic system 200. A spatially and temporally coherent light beam 202 is incident on a beam splitter 204. In one example, beam 202 can be formed from a similar illumination and/or radiation system as described above for beam 102. Beam splitter 204 separates the beam 202 into first and second beams 206A and 206B. In one example, beam splitter 204 produces only first diffraction order beams as beams 206A and 206B. The two beams 206A and 206B are then redirecting by first and second reflecting surfaces 208A and 208B, respectively, towards a substrate 210. An interference pattern 212 is formed at a top surface the substrate 210. The interference pattern 212 exposes a photoresist layer (not labeled in FIG. 2) across exposure field 214. Beams 206A and 206B and substrate 210 can be moved with respect to each other, as described above, or remain stationary.

Reflecting surfaces 208A and 208B in FIG. 2 are oriented in positions that allow for a larger angle of incidence on substrate 210, as compared to the orientation of reflecting surfaces 108A and 108B in FIG. 1. The larger angle of incidence allows for an increased resolution in patterns formed on substrate 210 by fringes 212 as compared to patterns formed on substrate 110 by fringes 112.

In one example, beam 206A has a path length a between beam splitter 204 and reflecting surface 208A, while beam 206B has a path length b between beam splitter 204 and reflecting surface 208B. Similarly, beam 206A has a path length c between reflecting surface 208A and substrate 210, while beam 206B has a path length d between reflecting surface 208B and substrate 210. In the example shown, the interferometer 200 may be referred to as a non-symmetrical system because a+c≠b+d, which may produce substantially non-uniform fringe pattern 212 across an exposure field 214, which is undesirable. For example, although fringes are well formed and high contrast at a center position 216, moving away from the center position 216 in either direction causes a differential in beam path length and an image contrast value due to loss of temporal coherence in the beams. Beams 206A and 206B do not properly interfere across their entire width, only at the center 216 of the exposure field 214. Thus, at high resolutions in an image fringes 212 across field 214 producing the image may not be of consistent contrast, i.e., there is a maximum contrast ratio at the center 216 of the exposure field 214. Therefore, only part of fringes 212 may produce an optimum image.

Since the interferometer 200 is a non-symmetrical system, there can be a problem with coherency matching over the full width of the exposure field 214. There are two types of coherence that are typically of concern for this type of imaging: (1) spatial coherence (i.e., space/position based) and (2) temporal coherence (i.e., time based), which are discussed in more detail below. In general, the concept of coherence is related to the stability, or predictability, of phase. Rays at substrate position emulate from the same position on the beam splitter 204.

Spatial coherence describes the correlation between light beams at different points in space. Spatial coherence is described as a function of distance, i.e., spatial coherence is the maintenance of a fixed-phase relationship across the full diameter of a cross section of a beam.

Temporal coherence describes the correlation or predictable relationship between light beams observed at different moments in time. In optics, temporal coherence is measured by combining beams from the same source, but having a known path length difference, and observing the interference pattern produced. In one example, a temporal coherence length is calculated by dividing a wavelength squared by the bandwidth of the beam.

In one example, coherency matching (temporal coherence) can become mismatched because the beam angles at the beam splitter 204 are not the same as at the angles at the substrate 210, which results in the non-symmetrical path lengths (e.g., a+c≠b+d). For example, the angles are the same for the Talbot interferometer 100 based on the fact it has fully symmetric path lengths. This results in the fringes 112 from the two interfering laser beams 106A and 106B being equal at all points across the exposure field 114. However, the angles are not the same for the Talbot interferometer 200 based on the fact Talbot interferometer 200 does not have fully symmetric path lengths for the two interfering beams 206A and 206B. This can result in fringe contrasts differing by an increasing amount as the beams 206A and 206B are displaced from center 216 of field 214. In one example, cases of very high resolution imaging may only be able to utilize the central band in the middle 216 of the field 214 for imaging, which decreases the size of an allowable portion of field 214 for imaging, decreasing throughput.

Exemplary Interferometric Lithography Systems with Path Length Equalization

Figure 3:
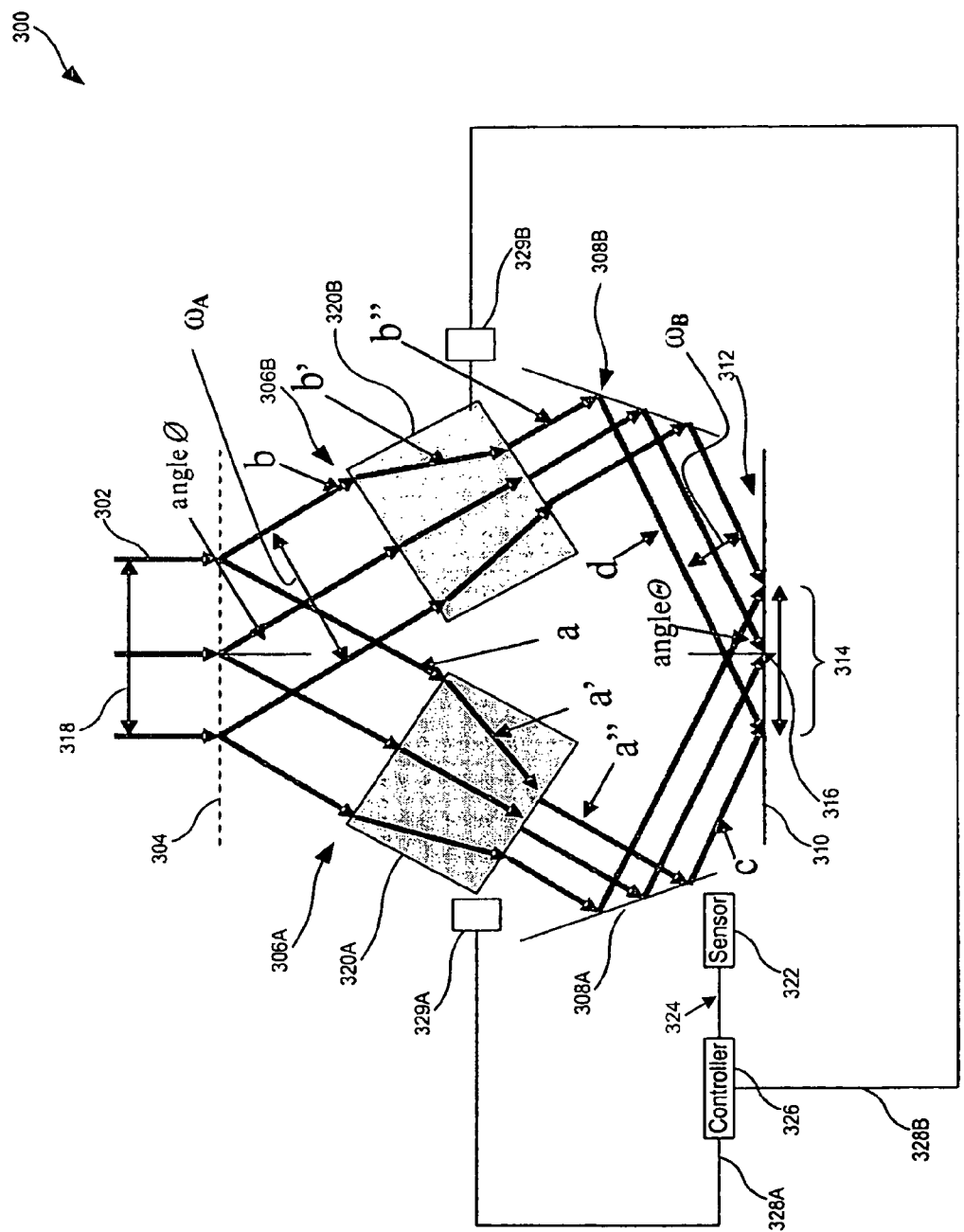
FIG. 3 illustrates a Talbot interferometric patterning system having first and second beam width adjusting systems, according to one embodiment of the present invention.

FIG. 3 shows an interferometer 300 that includes first and second optical systems 320A and 320B in paths a and b, respectively, according to one embodiment of the present invention. In one example, first and second optical systems 320A and 320B can be first and second beam width adjusting systems (e.g., expanding, adjusting, reduction, demagnifying, etc.). A spatially and temporally coherent (light) beam of radiation 302 having a beam width 318 is incident on a beam splitter 304. Beam 302 is formed from a similar system as described above for beam 102. Beam splitter 304 separates the beam 302 into first and second beams 306A and 306B. The two beams 306A and 306B are processed in respective optical systems 320A and 320B before being redirected by first and second reflecting surfaces 308A and 308B, respectively, towards a substrate 310. An interference pattern 312 is formed at a top surface the substrate 310. The interference pattern 312 exposes a photoresist layer (not labeled in FIG. 3) across exposure field 314. Again, it is to be appreciated that substrate 310 can be located on a stage, table, or the like (not shown) that allows for movement of the substrate 310 with respect to the writing image to allow for patterning of an entire surface of the substrate 310 using different techniques, as would be apparent to a skilled artisan upon reading and understanding this description. Alternatively, substrate 310 can remain stationary. A1

Optical systems 320A and 320B are beam width adjusting systems. In interferometer 300, the path length of laser beams 306A and 306B are adjusted across their width 318 (e.g., width $\omega_B$ of beam 306B, where only width of beam 306B is shown for convenience) by introducing beam width adjusting systems 320A and 320B into each arm of the Talbot interferometer 300. In one example, beam width adjusting systems 320A and 320B can consists of a two lens demagnifer with a planar image field (flat focal field) having a respective demagnifier ratio, as is discussed in more detail below. The demagnifier ratio of each beam width adjusting system 320A and 320B is set to equalize the path lengths at the extreme points of the exposure field 314.

In this example, beam 306A has a path length a between beam splitter 304 and beam width adjusting system 320A, path length a' within beam width adjusting system 320A, and path length a" from beam width adjusting system 320A to reflecting surface 308A. Beam 306B has a path length b between beam splitter 304 and beam width adjusting systems 320B, path length b' within beam width adjusting system 320B, and path length b" from beam width adjusting system 320B to reflecting surface 308B. Between the reflectors 308A and 308B and substrate 310, beam 306A has a path length c between reflecting surface 308A and substrate 310, In this example, through use of beam width adjusting systems 320A and 320B, interferometer 300 may be referred to as a symmetrical system because (a+a'+a")+c=(b+b'+b")+d, which produces substantially uniform fringes 312 across an entire exposure field 314, which is desirable.

A derivation of the calculation of demagnification ratio of each beam width adjusting system 320A and 320B is based on the following variables:

Ø—diffraction angle at the beam splitter
Θ—beam angle forming fringes
$\omega_A$—beam width after beam splitter
$\omega_B$—beam width at the exposure field
$P_{r1}$=Beam path difference between right and left
$PA_{r1}$=Beam path difference between right and left beams after beam splitter
$PB_{r1}$=Beam path difference between right and left beams at substrate exposure field
$n_A$=Refractive index of air=1.0
$n_B$=Refractive index at substrate area Using these variables, the derivation is:

$$P_{r1} = PA_{r1} - PB_{r1}$$

$$PA_{r1} = n_A \omega_A \tan \varnothing$$

$$PB_{r1} = n_B \omega_B \tan \Theta$$

Therefore:

$$P_{r1} = n_A \omega_A \tan(\varnothing) - n_B \omega_B \tan(\Theta)$$

For:

$$P_{r1} = 0 \text{ (uniform fringes)}$$

Then:

$$\omega_A \tan \varnothing = n_B \omega_B \tan \Theta$$

and

Demagnification $(M) = \omega_A/\omega_B = n_B \tan(\Theta)/\tan(\varnothing)$

For example, when using an exemplary set of values: $\Theta=70$; $\tan(\Theta)=2.75$; $n_B=1.65$ (water); $\tan(\varnothing)=0.23$; $\varnothing=13$, beam width at beam splitter 304 ~120 mm, fringe width at substrate 310 ~30 mm, then:

Magnification=12× with planar focus fields both sides.

In another example, optical elements (not shown in FIG. 3) within each beam width adjusting system 320A and 320B can be dynamically controlled in a feedback loop to dynamically adjust the demagnification ratio. For example, a sensor 322 (e.g., an optical sensor, a detector, or the like) is positioned to detect contrast value of fringes 312 across field 314. A signal 324 from sensor 322 is transmitted to controller 326. Controller 326 processes signal 322, and generates first and second control signals 328A and 328B, which are transmitted to adjusting systems 329A and 329B of respective beam width adjusting systems 320A and 320B. Control signals 328A and 328B are used to adjust the optical elements in beam width adjusting system 320A and 320B via respective adjusting systems 329A and 329B to position and/or orient the optical elements so that a maximum contrast value is achieved across field 314. For example, this can be done through actuators, motors, or the like (not shown) in adjusting systems 329A and 329B coupled to the optical elements in respective beam width adjusting systems 320A and 320B.

Thus, through the addition of the beam width adjusting systems 320A and 320B in interferometer 300, fringes 312 having a desired resolution and having uniform contrast are printed over a large field area 314. In this manner, interference fringes 312 can be uniformly printed over greater than 26 mm field at resolution values of 32 nm L/S (line/space) using a beam splitter 304 having a 1 μm pitch phase grating.

In another example, one or both of the reflecting surfaces 208A or 308A and 208B or 308B in FIG. 2 or 3, respectively, may comprise a spatial light modulator that may be used to control the phase of the beams 206A or 306A and 206B or 306B so as to optimize the uniformity of the interference fringes 212 or 312 over the exposure field 214 or 314. The spatial light modulator may be an array of programmable mirrors, and each mirror may be tilted or displaced to change the phase and/or direction of the beams. In one example, with the aid of the spatial light modulator, beam width adjusting systems 320A and/or 320B may not be necessary to optimize the uniformity in the exposure field 314.

It is to be appreciated that, although beam width adjusting systems 320A and 320B are shown in respective first arms a and b of interferometer 300, they may alternatively be placed in second arms c and d of interferometer 300 without departing from the scope of the present invention.

Exemplary Beam Adjusting Systems

Figure 4:
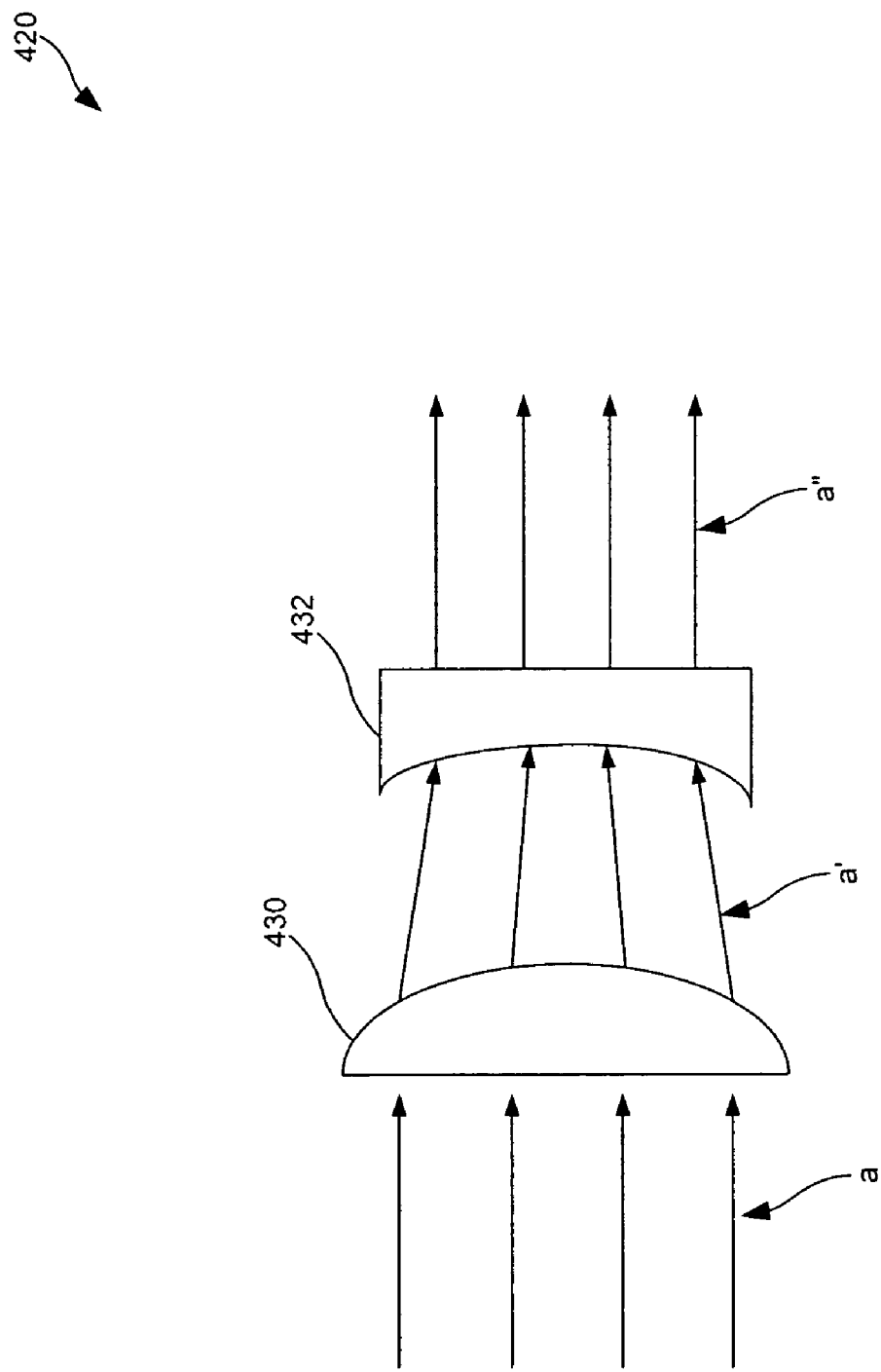
FIGS. 4 and 5 show side and perspective views, respectively, of an optical system that can be used as one of the beam width adjusting systems in FIG. 3, according to one embodiment of the present invention.
Figure 5:
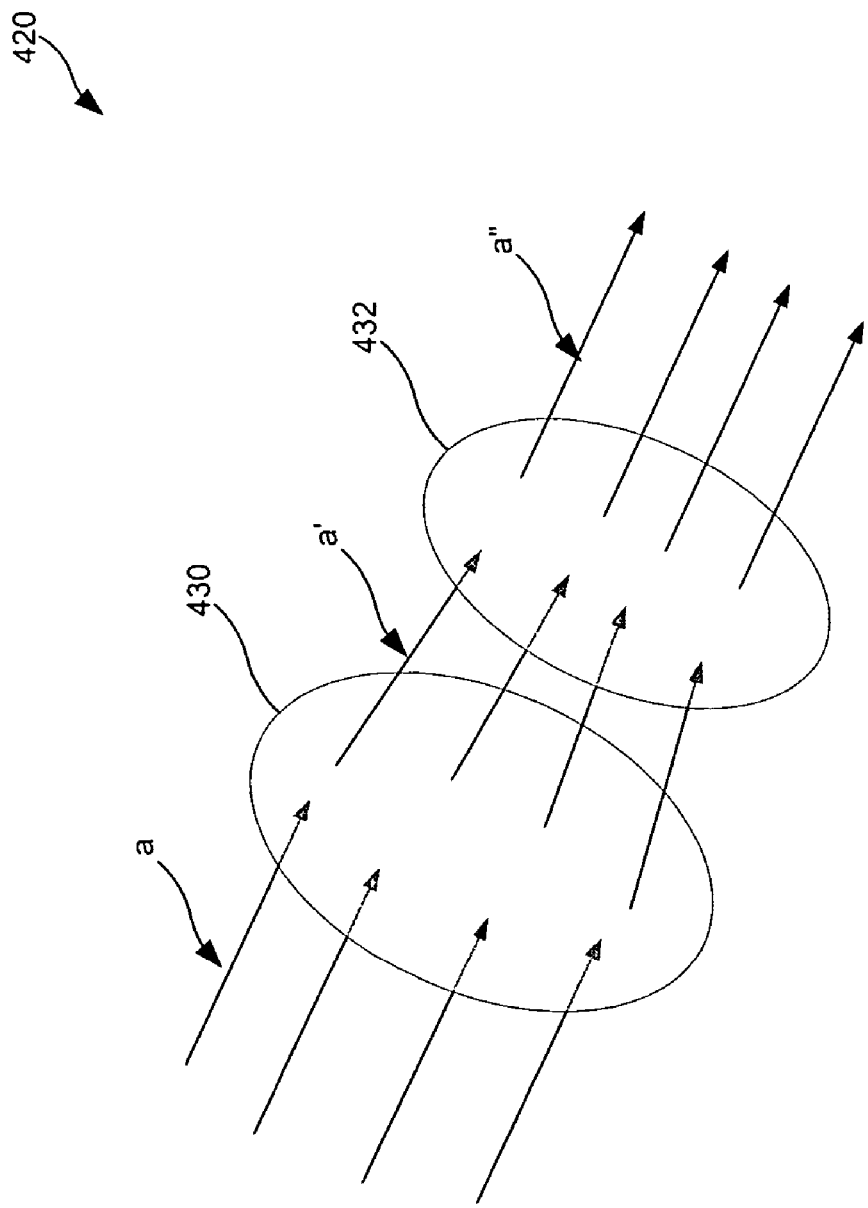

FIGS. 4 and 5 show side and perspective views, respectively, of an optical system 420 used to implement at least one of the beam width adjusting systems 320A and 320B, according to one embodiment of the present invention. System 420 includes a concave lens 430 in series with a convex lens 432. The light paths and path lengths through lenses 430 and 432 are shown in FIGS. 4 and 5 corresponding to similar characteristics shown in FIG. 3.

In one example, a pinhole aperture (not shown) can be located between lenses 430 and 432, as would become apparent to a skilled artisan upon reading and understanding the description.

Figure 6:
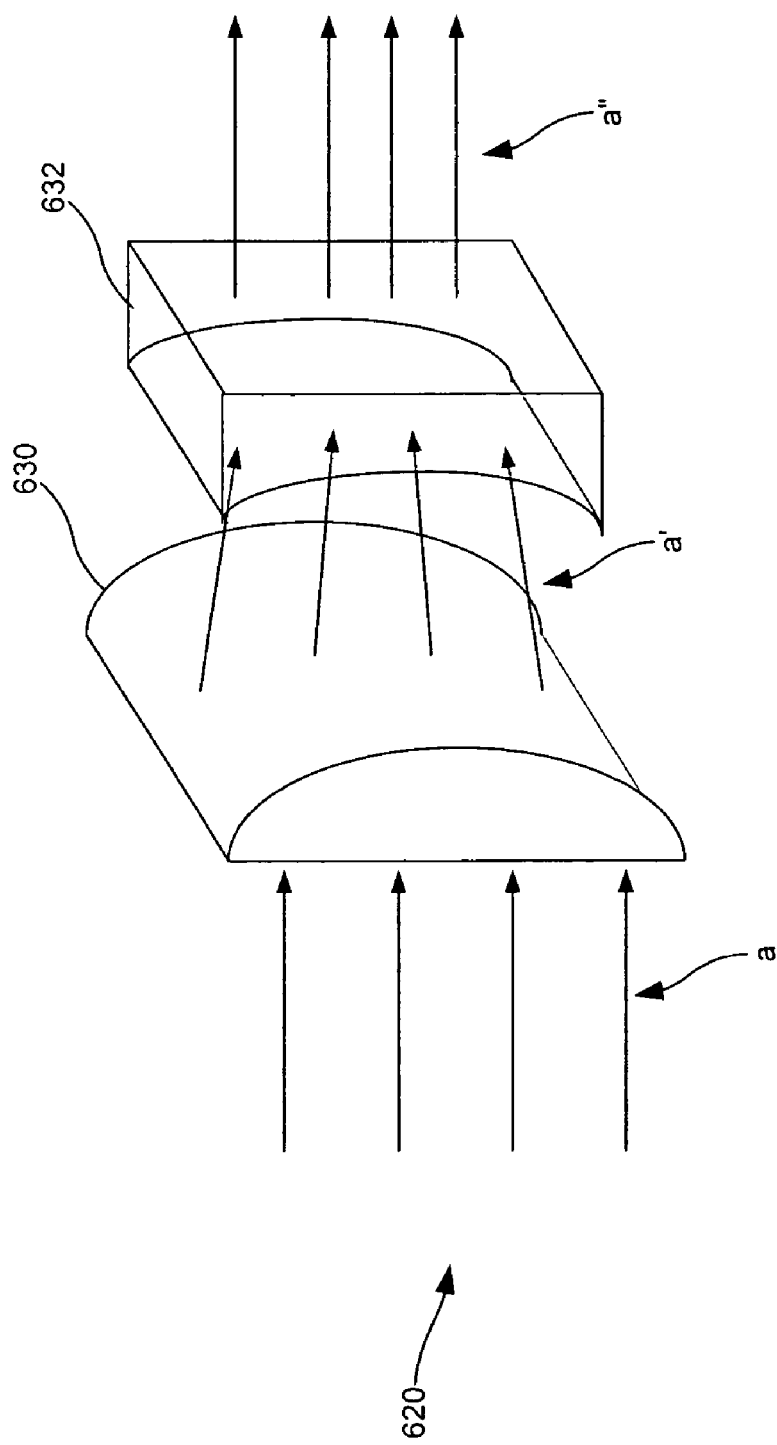
FIG. 6 shows an optical system that can be used as one of the beam width adjusting systems in FIG. 3, according to one embodiment of the present invention.

Alternatively, FIG. 6 shows an optical system 620 for the beam width adjusting systems 320A and 320B, according to one embodiment of the present invention. System 620 includes a pair of cylindrical lenses 630 and 632 in series. The light paths and path lengths through cylindrical lenses 630 and 632 are shown in FIG. 6 corresponding to similar characteristics shown in FIG. 3.

Figure 7:
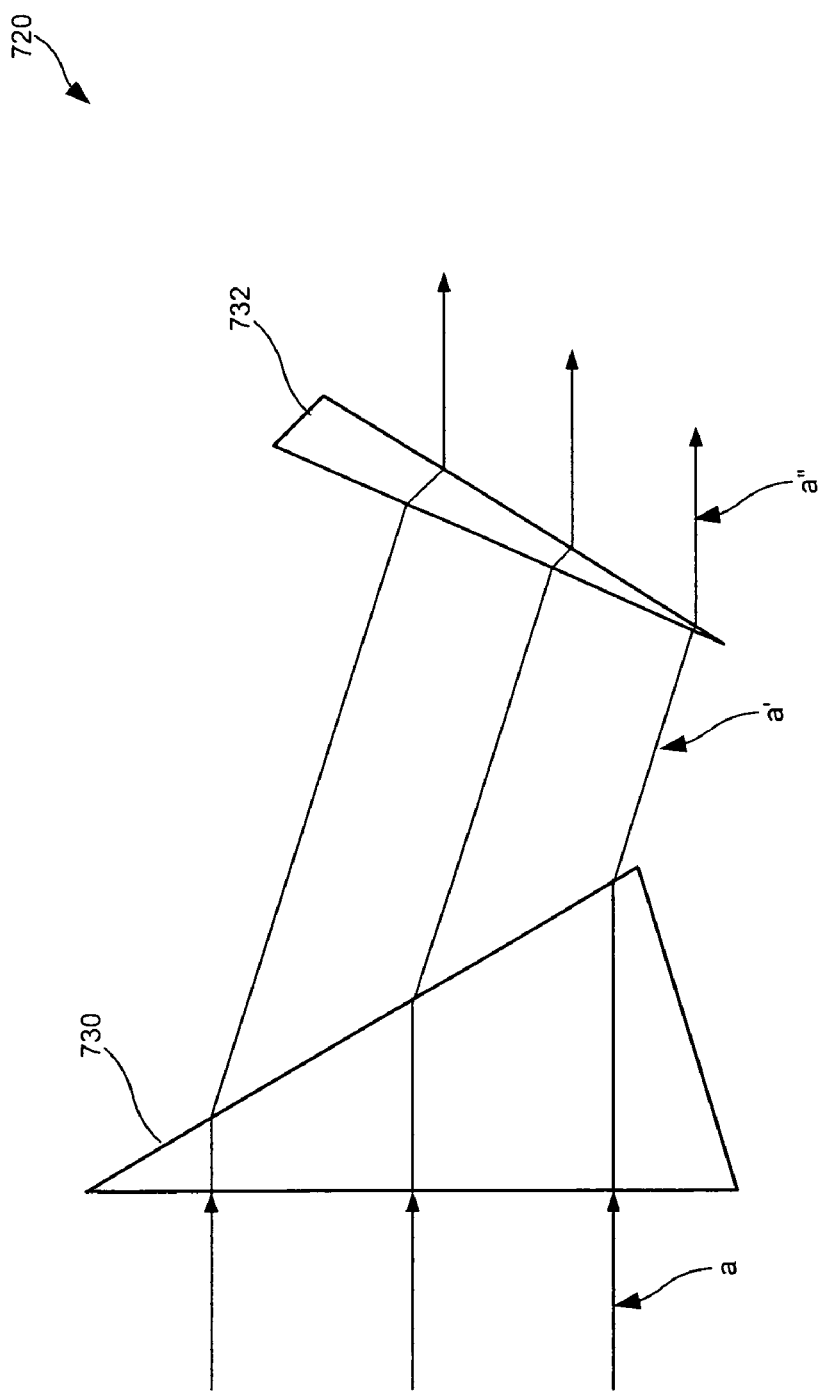
FIGS. 7 and 8 show side and perspective views, respectively, of an optical system that can be used as one of the beam width adjusting systems in FIG. 3, according to one embodiment of the present invention.
Figure 8:
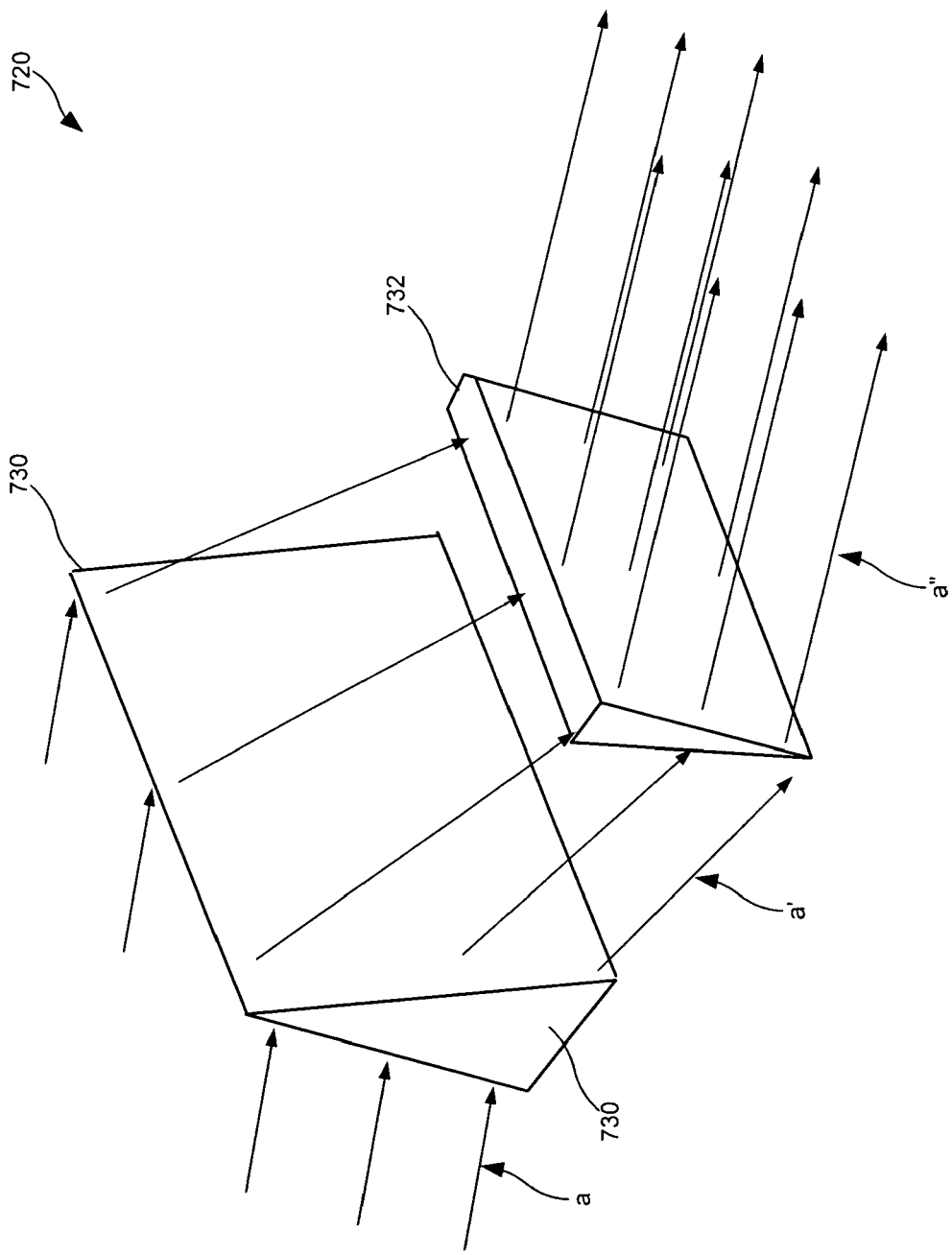

FIGS. 7 and 8 show side and perspective views, respectively, of optical system 720, which can be used as at least one of the beam width adjusting systems 320A and 320B, according to yet another embodiment of the present invention. System 720 includes a pair of prisms 730 and 732 in series. The light paths and path lengths through prisms 730 and 732 are shown in FIGS. 7 and 8 corresponding to similar characteristics shown in FIG. 3.

It is to be appreciated other optical systems could also be used, as would become apparent to one of ordinary skill in the relevant arts upon reading and understanding this description. Moreover, optical systems 420, 620, and 720 can be used in combination to form beam width adjusting systems 320A and 320B. Also, more than two optical elements can be used in one or both beam width adjusting systems 320A and/or 320B.

Exemplary Operation

Figure 9:
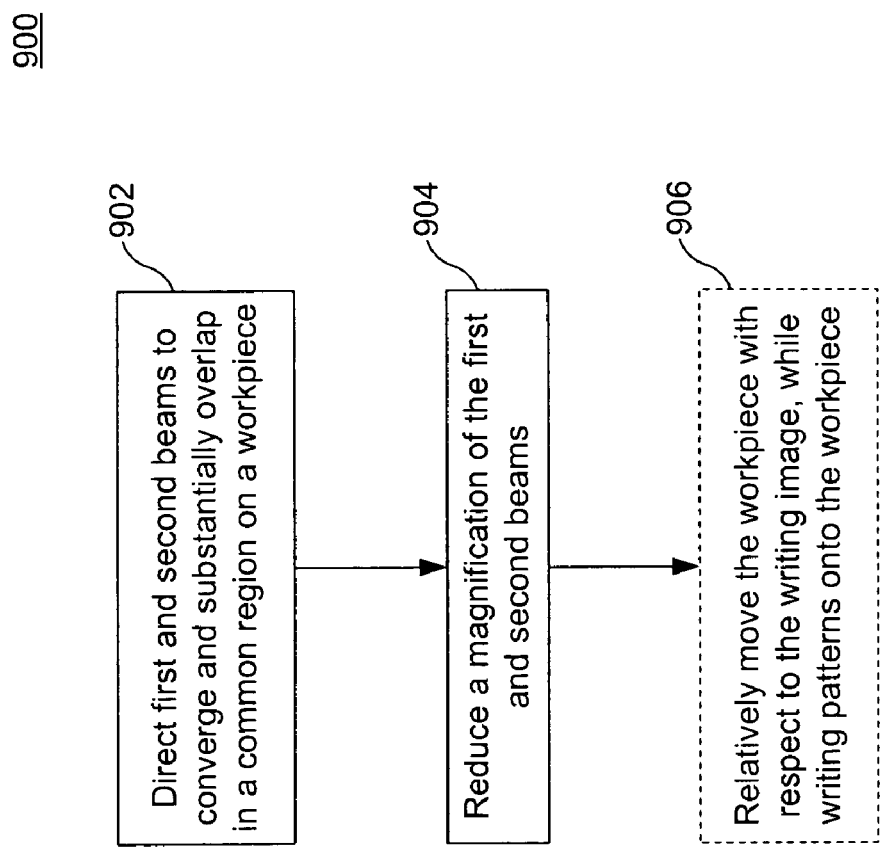
FIG. 9 shows a flowchart depicting a method, according to one embodiment of the present invention.

FIG. 9 shows a flowchart depicting a method 900, according to one embodiment of the present invention. For example, a method of writing patterns onto a substrate using an interference lithography tool, according to this embodiment of the present invention. In step 902, first and second beams are directed to converge and substantially overlap in a common region on a substrate. This can be done so that the first and second beams are mutually temporally coherent and spatially coherent in the region of overlap and to form interference fringes to define a writing image. In step 904, a cross section of the first and second beams is adjusted. This can be done so that respective path lengths of the beams are matched when they reach a common region (e.g., 314) to ensure the first and second beams are mutually spatially coherent and temporally coherent across an entire width of the common region. Optionally, in step 906, in one embodiment, the substrate is moved with respect to the writing image, while writing patterns onto the substrate. In another embodiment, it can remain stationary.

The above description refers to light, light sources and beams of light. It will be appreciated that the light referred to is not limited to light having a particular wavelength, and can include other wavelengths including (extreme) ultraviolet light or infrared light which are suitable for lithography, as discussed above.

Although specific reference can be made in this text to the use of lithographic apparatus in the manufacture of a specific device (e.g., an integrated circuit or a flat panel display), it should be understood that the lithographic apparatus described herein can have other applications. Applications include, but are not limited to, the manufacture of integrated circuits, integrated optical systems, guidance and detection patterns for magnetic domain memories, flat-panel displays, liquid-crystal displays (LCDs), thin-film magnetic heads, micro-electromechanical devices (MEMS), light emitting diodes (LEDs), etc. Also, for instance in a flat panel display, the present apparatus can be used to assist in the creation of a variety of layers, e.g. a thin film transistor layer and/or a color filter layer.

Although specific reference can have been made above to the use of embodiments of the invention in the context of optical lithography, it will be appreciated that the invention can be used in other applications, for example immersion lithography. The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the patterning device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

While specific embodiments of the invention have been described above, it will be appreciated that the invention can be practiced otherwise than as described. For example, the invention can take the form of a computer program containing one or more sequences of machine-readable instructions describing a method as disclosed above, or a data storage medium (e.g. semiconductor memory, magnetic or optical disk) having such a computer program stored therein.

Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method to write patterns onto an exposure field on a substrate, comprising:
   directing first and second temporally coherent and spatially coherent beams of radiation to substantially overlap in the exposure field on the substrate, such that the first and second beams form interference fringes;
   adjusting a beam width of the first beam, such that respective path lengths of the beams are matched when they reach the exposure field to ensure the first and second beams are mutually spatially coherent and temporally coherent across a full width of the exposure field.

2. The method of claim 1, further comprising:
   causing diffraction of a radiation beam to form the first and second beams.

3. The method of claim 1, further comprising:
   relatively moving the substrate with respect to the exposure field while writing patterns onto the substrate.

4. The method of claim 1, further comprising reducing magnification by passing the first and second beams through respective first and second magnification reduction optical systems.

5. The method of claim 4, further comprising passing the first beam through a first convex lens and a first concave lens and passing the second beam through a second convex lens and a second concave lens.

6. The method of claim 4, further comprising passing the first beam through a first pair of cylindrical lenses and passing the second beam through a second pair of cylindrical lenses.

7. The method of claim 4, further comprising passing the first beam through a first pair of prisms and the second beam through a second pair of prisms.

8. The method of claim 4, further comprising passing the first beam through first and second optical elements and passing the second beam through third and fourth optical elements.

9. The method of claim 1, furthering comprising reducing, expanding or demagnifying the beam width to perform the adjusting.

10. The method of claim 1, further comprising:
    measuring a contrast of the fringes across a region of overlap; and
    adjusting magnification to maximize contrast across the region of overlap.

11. The method of claim 1, wherein the directing is performed using tiltable mirrors.

12. The method of claim 1, wherein the directing is performed using a spatial light modulator.

13. The method of claim 1, further comprising forming the first and second beams from a beam of radiation having a short temporal coherence length.

14. The method of claim 1, further comprising:
    adjusting a beam width of the second beam, such that respective path lengths of the beams are matched when they reach the exposure field to ensure the first and second beams are mutually spatially coherent and temporally coherent across a full width of the exposure field.

15. A system for writing a pattern onto an exposure field on a substrate, comprising:
    an optical directing device configured to direct first and second spatially coherent and temporally coherent beams of radiation to substantially overlap at the exposure field, such that overlapping beams form interference fringes in the exposure field; and
    a first beam width adjusting system located in the beam path of the first light beam, such that respective path lengths of the beams are matched when they reach the exposure field to maintain the spatial coherence and temporal coherence of the beams across a full width of the exposure field.

16. The system of claim 15, wherein the optical directing device comprises tiltable mirrors.

17. The system of claim 15, further comprising:
    a beam splitter configured to generate the first and second beams from a beam of radiation.

18. The system of claim 17, wherein the beam of radiation is generated from an excimer laser.

19. The system of claim 17, wherein the beam of radiation is generated from a source of radiation having a short temporal coherence length.

20. The system of claim 15, further comprising:
a detector configured to sense a contrast of the fringes across the exposure field and generate a signal;
a controller configured to receive the signal and generate a control signal therefrom; and
an adjusting device configured to receive the control signal and adjust the beam width adjustment system to maximize contrast across the exposure field.

21. The system of claim 20, wherein:
the beam width adjusting system comprises optical elements; and
the adjusting device Is configured to adjust position, or orientation, or both position and orientation, of the optical elements.

22. The system of claim 15, further comprising:
a second beam width adjusting system located in the beam path of the second light beam, such that respective path lengths of the beams are matched when they reach the exposure field to maintain the spatial coherence and temporal coherence of the beams across a full width of the exposure field.

23. The system of claim 22, wherein at least one of the beam width adjusting systems comprises a spatial light modulator.

24. The system of claim 22, wherein at least one of the beam width adjusting systems comprises a convex lens and a concave lens.

25. The system of claim 22, wherein at least one of the beam width adjusting systems comprises a cylindrical lens.

26. The system of claim 22, wherein at least one of the beam width adjusting systems comprises a prism.

27. The system of claim 22, wherein each of the first and second beam width adjusting systems comprise first and second optical elements.

28. The system of claim 27, wherein the first optical element and second optical element each comprise a pair of cylindrical lenses, a pair of concave and convex lenses, or a pair of prisms.

29. A system, comprising:
a beam splitter configured to split a beam of radiation into first and second beams;
a first beam width adjusting system configured to receive the first beam and output a first beam width adjusted beam, such that respective path lengths of the first and second beams are matched; and
a first reflector configured to direct the first beam width adjusted beam to interfere with the second beam at an exposure field of a substrate, such that fringes formed by the interference form an image on the substrate.

30. The system of claim 29, wherein the beam splitter comprises a phase shifting, an alternating phase shifting, or a binary phase shifting beam splitter.

31. The system of claim 29, wherein the beam width adjusting system comprises optical elements, and the system further comprises:
a detector configured to sense a contrast value of the fringes;
a controller configured to receive a signal from the detector and output a control signal based on the contrast value; and
a first adjusting system, coupled to the first beam width adjusting system, configured to receive the control signal and thereby control orientation or position of an optical element within the first beam width adjusting system.

32. The system of claim 29, further comprising:
a substrate stage configured to move the substrate relative to the image field.

33. The system of claim 29, further comprising:
a second beam width adjusting system configured to receive the second beam and output a second beam width adjusted beam, such that respective path lengths of the first beam width adjusted beam and the second beam width adjusted beam are matched; and
a second reflector configured to direct the second beam width adjusted beam to interfere with the first beam width adjusted beam at the exposure field of the substrate, such that fringes formed by the interference form an image on the substrate.

34. The system of claim 33, wherein the first and second beam width adjusting systems each comprises a pair of concave and convex lenses, a pair of cylindrical lenses, or a pair of prisms.

35. The system of claim 33, wherein the first and second beam width adjusting systems are configured such that the first beam and first beam width adjusted beam have a substantially similar combined path length as the second beam and the second beam width adjusted beam to maintain a mutual spatial coherency and temporal coherence before they interfere.

36. The system of claim 33, wherein the first and second beam width adjusting systems are configured to expand, reduce, or demagnify a width of respective ones of the first and second beams.

* * * * *